US008643773B2

(12) United States Patent
Mochiduki (10) Patent No.: US 8,643,773 B2
(45) Date of Patent: Feb. 4, 2014

(54) MANUFACTURING METHOD OF SOLID-STATE IMAGING APPARATUS, SOLID-STATE IMAGING APPARATUS, AND ELECTRONIC IMAGING APPARATUS

(75) Inventor: Katsuhisa Mochiduki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 415 days.

(21) Appl. No.: 12/503,888

(22) Filed: Jul. 16, 2009

(65) Prior Publication Data

US 2010/0045832 A1 Feb. 25, 2010

(30) Foreign Application Priority Data

Aug. 19, 2008 (JP) ................................. 2008-210528

(51) Int. Cl.
*H04N 5/225* (2006.01)
*H04N 9/083* (2006.01)
*C09J 7/00* (2006.01)

(52) U.S. Cl.
USPC ............................. 348/374; 348/294; 156/313

(58) Field of Classification Search
USPC .................................... 348/374, 294; 156/313
See application file for complete search history.

(56) References Cited

U.S. PATENT DOCUMENTS 7,719,600 B2 * 5/2010 Kaihara et al. ................ 348/335
8,009,222 B2 * 8/2011 Watanabe et al. ............. 348/340
2002/0195676 A1 * 12/2002 Hamamoto et al. .......... 257/433
2003/0025824 A1 * 2/2003 Ishikawa ....................... 348/374
2003/0098912 A1 5/2003 Hosokai et al. ........... 348/207.99
2004/0012714 A1 * 1/2004 Kawai ........................... 348/374
2007/0215780 A1 * 9/2007 Eichert et al. ................. 248/497

FOREIGN PATENT DOCUMENTS

JP 05-043668 A 6/1993
JP 2000-333050 A 11/2000
JP 2003-163342 A 6/2003
JP 2005-318483 A 11/2005

OTHER PUBLICATIONS

Japanese Communication dated Nov. 16, 2012, issued in connection with counterpart Japanese Patent Application No. 2008-210528, with English translation.

* cited by examiner

*Primary Examiner* — Roberto Velez
*Assistant Examiner* — Joel Fosselman
(74) *Attorney, Agent, or Firm* — Fitzpatrick, Cella, Harper & Scinto (57) ABSTRACT

A manufacturing method of a solid-state imaging apparatus includes the steps of: preparing a solid-state imaging device having a light receiving region at a main surface thereof; preparing a light transmitting member having an extending portion extending from the solid-state imaging device; preparing a holding member having a space for holding the solid-state imaging device therein, and having a positioning portion for positioning the solid-state imaging device; fixing the light transmitting member to the main surface of the solid-state imaging device in parallel to each other to keep a constant interval therebetween; bringing a side of the solid-state imaging device to meet the positioning portion of the holding member; and fixing the extending portion of the light transmitting member to the holding member.

29 Claims, 5 Drawing Sheets

MANUFACTURING METHOD OF SOLID-STATE IMAGING APPARATUS, SOLID-STATE IMAGING APPARATUS, AND ELECTRONIC IMAGING APPARATUS

BACKGROUND OF THE INVENTION

1. Field of the Invention

The present invention relates to a manufacturing method of a solid-state imaging apparatus, such as a charge coupled device (CCD) and a complementary metal oxide semiconductor (CMOS), a solid-state imaging apparatus, and an electronic imaging apparatus mounted with the solid-state imaging apparatus.

2. Description of the Related Art

A dual inline package (DIP) and a small outline package (SOP), each made of a ceramic or a resin material, have been widely used as a conventional solid-state imaging apparatus.

A conventional solid-state imaging apparatus is configured so that the electrodes of a solid-state imaging device and the lead frames formed on a package are bonded together with bonding wires, such as Au lines. Moreover, a light transmitting member is made to adhere to a package surface on the light receiving surface side of the solid-state imaging device. It is required for an electronic imaging apparatus, such as a digital camera and a video camera, using this sort of solid-state imaging apparatus to perform an adjustment of a relative positional relation between the solid-state imaging device and an optical viewfinder, and an adjustment of the position of the solid-state imaging device in relation to focusing at the time of assembling the electronic imaging apparatus.

In this adjustment, the following adjustments are necessary: (1) the adjustment of positioning in focusing direction, (2), (3) the adjustments of up, down, left, and right tilts for the prevention of partial blurring, (4), (5) the adjustments in horizontal and vertical directions for field angle adjustment, and (6) tilt and rotation adjustments.

Consequently, at least the adjustments of six axes are needed. One of this sort of solid-state imaging apparatus is disclosed in U.S. Patent Publication No. 2003-0025824 and Japanese Patent Application Laid-Open No. 2000-333050.

SUMMARY OF THE INVENTION

The conventional solid-state imaging apparatus is required to perform the six axis adjustment at the time of being incorporated into an electronic imaging apparatus to every solid-state imaging apparatus, and the adjustments are a step taking a very long operation time. Consequently the cost of the electronic imaging apparatus itself is pushed up.

In the first place, a factor of the necessity of the six axis adjustment resides in a die bonding step of making the solid-state imaging device adhere to the package and fixing it thereto. That is, the factor resides in the limitations of the horizontal resolution, vertical resolution, and rotational resolution of the head of a die bonding apparatus to cause the dispersion of the positions of the solid-state imaging apparatus in the horizontal, vertical, and rotational directions.

Another factor resides in the occurrence of the dispersion of focus in the depth direction and the dispersion of up, down, left, and right tilts of a mounted solid-state imaging device owing to the factors of an individual difference of the size of a package itself, a bend of the die attaching surface of the package, on which a solid-state imaging device is placed, and the like.

It is an object of the present invention to provide a manufacturing method of a solid-state imaging apparatus, a solid-state imaging apparatus, and an electronic imaging apparatus, each capable of eliminating the need of the six axis adjustment taking a long operation time at the time of incorporating the solid-state imaging apparatus into the electronic imaging apparatus to enable the simple and no-time requiring assembly of the solid-state imaging apparatus.

An aspect of the present invention is a manufacturing method of a solid-state imaging apparatus comprising steps of: preparing a solid-state imaging device having a light receiving region at a main surface thereof; preparing a light transmitting member having an area facing the main surface of the solid-state imaging device, and an extending portion extending from the area facing the main surface; preparing a holding member having a space for holding the solid-state imaging device therein, and having a positioning portion for positioning the solid-state imaging device; fixing the light transmitting member to the main surface of the solid-state imaging device in parallel to each other to keep a constant interval therebetween; bringing a side of the solid-state imaging device to meet the positioning portion of the holding member; and fixing the extending portion of the light transmitting member to the holding member.

According to the present invention, the operations of the six axis adjustment, which have been necessary at the time of incorporating a solid-state imaging apparatus into an electronic imaging apparatus, can be rendered unnecessary. Consequently, the assembly operation of the solid-state imaging apparatus can be made remarkably simple, and the electronic imaging apparatus can be manufactured at a low cost.

Further features of the present invention will become apparent from the following description of exemplary embodiments with reference to the attached drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

In the following, exemplary embodiments for implementing the present invention will be described in detail with reference to the attached drawings.

Figure 1:
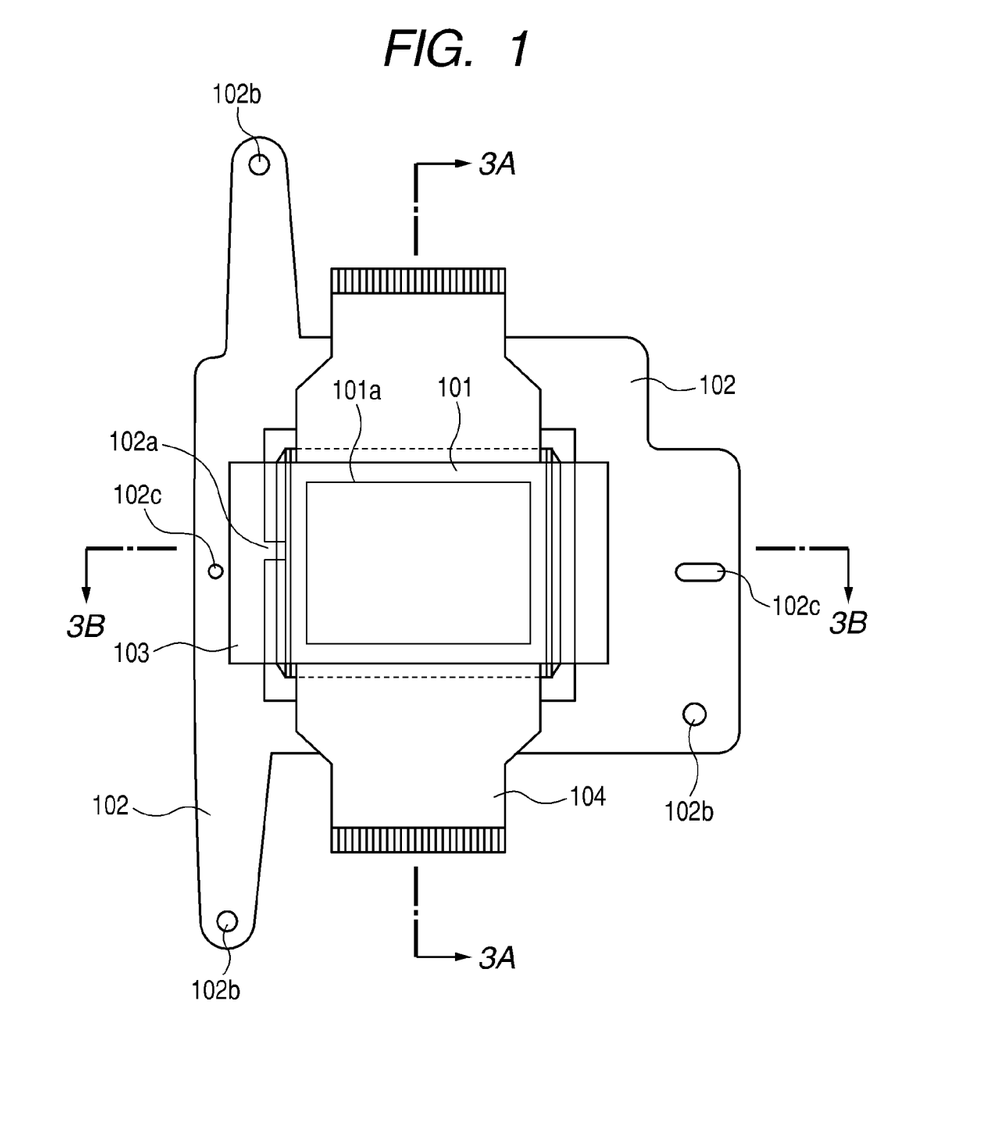
FIG. 1 is a plan view illustrating an embodiment of a solid-state imaging apparatus according to the present invention.
Figure 2:
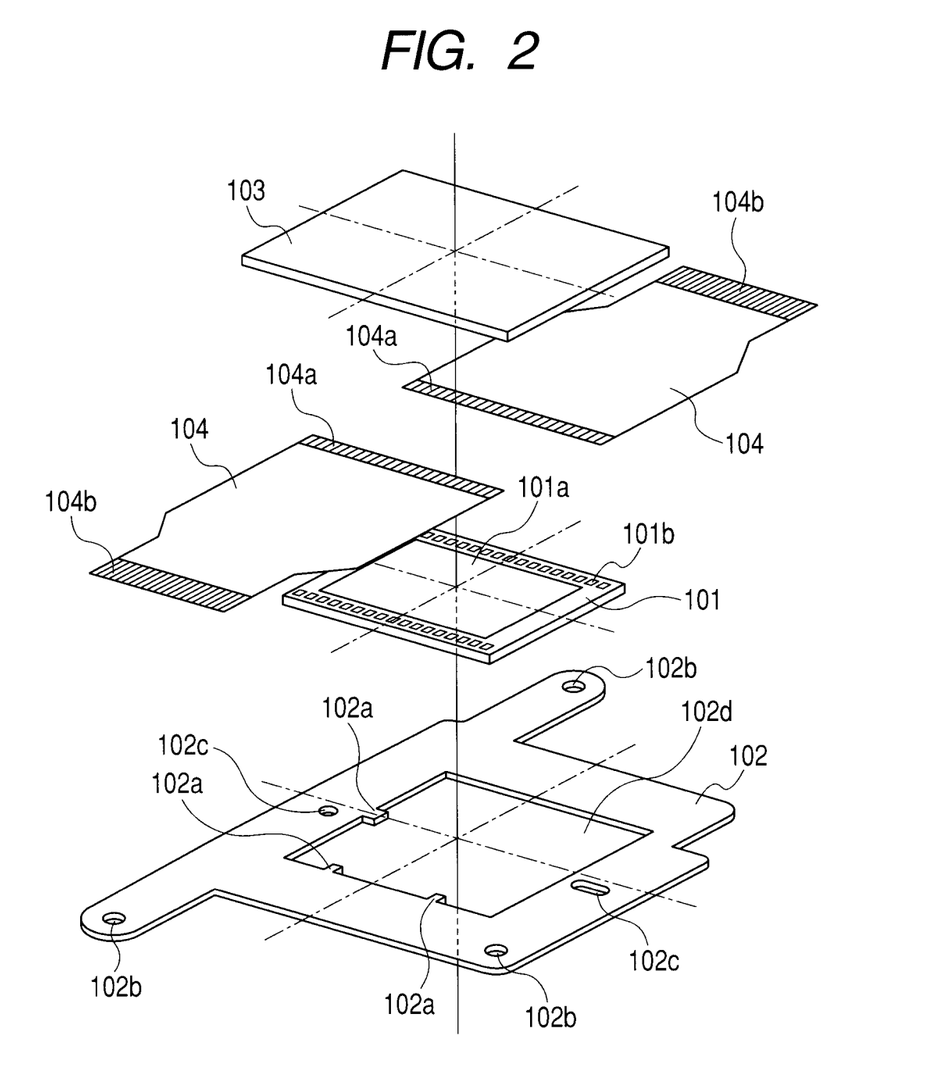
FIG. 2 is an exploded perspective view of the solid-state imaging apparatus of FIG. 1.
Figure 3A:
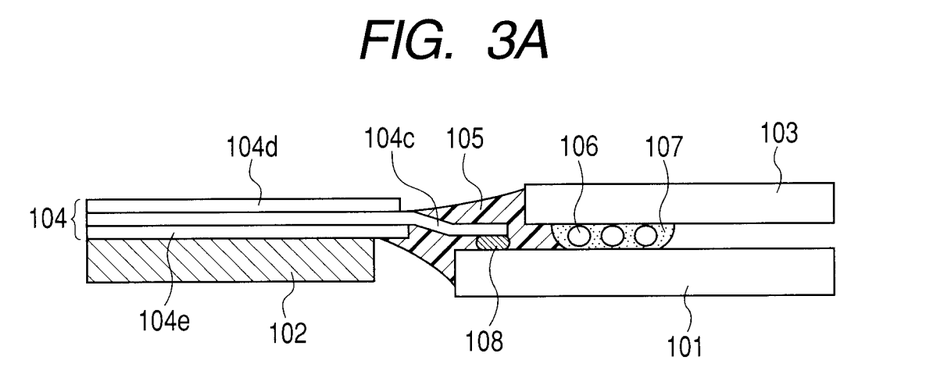
FIG. 3A is a sectional view taken along the line 3A-3A of FIG. 1.
Figure 3B:
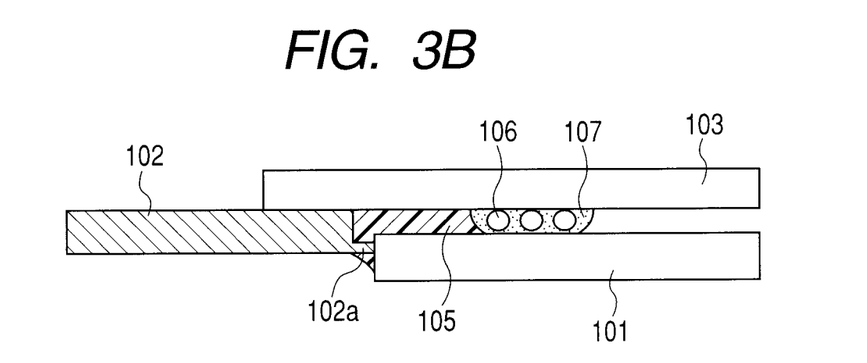
FIG. 3B is a sectional view taken along the line 3B-3B of FIG. 1.

FIG. 1 is a plan view illustrating an embodiment of a solid-state imaging apparatus according to the present invention. FIG. 2 is an exploded perspective view illustrating each part constituting the solid-state imaging apparatus in an exploded state. FIG. 3A is a sectional view taken along the line 3A-3A of FIG. 1, and FIG. 3B is a sectional view taken along the line 3B-3B of FIG. 1. FIG. 3A illustrates the bonding portion of the solid-state imaging device with a wiring substrate in detail.

In FIGS. 1 to 3B, a light receiving region 101a is formed on a main surface of a solid-state imaging device 101, such as a CCD or a CMOS. Electrodes 101b contributing to input and output signals of the solid-state imaging device 101 are formed in regions of the peripheral portions of the light receiving region 101a of the solid-state imaging device 101 over both of the opposing sides thereof. A light transmitting member 103 is arranged over the upper surface of the solid-state imaging device 101. As the light transmitting member 103 bonded to the solid-state imaging device 101, mainly glass or crystal is used, and the light transmitting member 103 is arranged over the light receiving surface of the solid-state imaging device 101 with a constant interval between them.

As the method of arranging the light receiving surface of the solid-state imaging device 101 and the light transmitting member 103 in parallel to each other with the constant interval between them, no especial limitations exist. For example, as illustrated in FIGS. 3A and 3B, there is a method of using spherical spacers 106. Moreover, it can be easily realized to arrange the light receiving surface of the solid-state imaging device 101 and the light transmitting member 103 in parallel to each other with the constant interval between them by using columnar spacers (not illustrated).

Furthermore, by making an adhesive 107 intervene in the surroundings of the spacers 106, the solid-state imaging device 101 and the light transmitting member 103 can be easily made to adhere to each other with the constant interval kept between them. The spacers 106 and the adhesive 107 are uniformly formed over four sides of the solid-state imaging device 101, and are arranged lest they should enter the light receiving region 101a of the solid-state imaging device 101.

In the configuration described above, the solid-state imaging device 101 and the light transmitting member 103 are arranged in parallel to each other with the constant interval between them, and consequently both of the parallelism between the light receiving surface of the solid-state imaging device 101 and the light transmitting member 103 and the distance between the light receiving surface of the solid-state imaging device 101 and the light transmitting member 103 can be secured to be constant. The light transmitting member 103 is structured to make at least a part thereof extend from the solid-state imaging device 101. That is, it is important to form at least a part of the light transmitting member 103 to be larger than the size of the solid-state imaging device 101. By extending at least a part of the light transmitting member 103 in this way and by using the extending part for bonding the light transmitting member 103 with a holding member 102, described below, the positional accuracy of the light transmitting member 103 can be easily secured.

Moreover, the whole of the light transmitting member 103 may be larger than the solid-state imaging device 101. In this case, the size of the light transmitting member 103 on the sides of both the opposing sides of the light transmitting member 103 on which sides the electrodes 101b are not formed on the solid-state imaging device 101 is preferably made to be larger than the size of the solid-state imaging device 101 if the electrodes 101b are formed on both of the opposing sides of the solid-state imaging device 101 as illustrated in FIGS. 1 and 2. Moreover, the light transmitting member 103 is more preferably shaped to situate its end faces between the electrodes 101b of the solid-state imaging device 101 and the light receiving region 101a on the sides of both of opposing sides on which the electrodes 101b are formed.

By shaping the light transmitting member 103 in this shape, the electrodes 101b are exposed after the light transmitting member 103 has been arranged over the solid-state imaging device 101, and consequently wiring substrates 104 can be attached after the adhesion of the light transmitting member 103. It is no doubt possible to attach the wiring substrates 104 before the arrangement of the light transmitting member 103, but by arranging the light transmitting member 103 beforehand, the time during which the solid-state imaging device 101 is exposed to the assembling environment can be shortened. Consequently, particles and the like that adhere to the light receiving region 101a of the solid-state imaging device 101 can be prevented.

The thickness of the light transmitting member 103 is not especially limited, but the thicknesses from 0.1 mm to 2.0 mm are suitably used. Each of the wiring substrates 104 is made of a flexible printed circuit board of the structure in which a conductive foil 104c made of Cu or the like is laminated on a base film 104e made of polyimide or the like and the conductive foil 104c is protected by being covered by an insulator 104d, such as solder resist, except for a terminal portion and a soldering portion as illustrated in FIG. 3A.

Inner leads 104a wired at the same pitches as those of the electrodes 101b formed on the solid-state imaging device 101 are formed on the conductive foil 104c, which is electrically bonded to the electrodes 101b of the solid-state imaging device 101, as illustrated in FIG. 2. Outer leads 104b are formed on the outer side of the wiring substrate 104, where electrical bonding to a not illustrated substrate of an electronic imaging apparatus body is performed.

Stud bumps 108 made of Au or the like are formed on the electrodes 101b formed on the solid-state imaging device 101 for bonding the electrodes 101b with the inner leads 104a of the wiring substrate 104 as illustrated in FIG. 3A. It is preferable to perform planarization processing to the upper surfaces of the stud bumps 108 in order to make the bonding of the stud bumps 108 with the inner leads 104a easy. After the relative positions of the stud bumps 108 to the inner leads 104a have been adjusted, the electrodes 101b and the inner leads 104a are electrically bonded together by gang bonding, single point bonding, or the like.

After the light transmitting member 103 and the wiring substrates 104 have been attached to the solid-state imaging device 101, the holding member 102 is attached to the solid-state imaging device 101. The holding member 102 has a space 102d capable of holding the light transmitting member 103 therein and at the same time holding the solid-state imaging device 101 therein as illustrated in FIG. 2. Moreover, the holding member 102 is a part having positioning portions 102a for positioning the solid-state imaging device 101. In the following, the holding member 102 will be described in detail.

As illustrated in FIG. 2, the holding member 102 is a plate-like member forming the space 102d capable of holding the solid-state imaging device 101 therein at the center of the holding member 102. The positioning portions 102a are formed on the holding member 102. The positioning portions 102a are integrated with the holding member 102, and are provided at three points of the holding member 102 so as to be projected into the space 102d as protrusions.

As a material for forming the holding member 102, a material having rigidity and being realizable of the dimensional accuracy of, for example, ±50 µm or less is suitable. Also as to the planarity of the material, the one realizable the processing accuracy of ±30 μm or less is suitable. More suitably, the planarity is ±10 μm or less. As the materials capable of acquiring these characteristics, the materials, such as plastic and metal, can be suitably selected.

In the case of plastic, the materials having rigidity are suitable, and for example, polycarbonate (PC), acrylonitrile butadiene styrene (ABS), POW, polypropylene (PP), polyethylene (PE), and PPEE are suitable. However, the materials are not limited to those listed in the above. Moreover, it is preferable that the materials have conductivity from the point of view of electro-static destruction.

In the case of metal, as the quality of material, for example, iron-nickel alloys, such as 42 alloy, 50 alloy, permalloy, Kovar, and Invar, and stainless steel, such as, stainless steel (SUS) 430, and SUS 304, are suitable, but the metals are not limited especially to the above-listed ones. It is also possible to suppress the surface roughness and the planarity to a desired extent or less by performing grinding, lapping, or the like, after a desired shape has been acquired by press working. In case of using a metal material, because the metal material has high conductivity, the influences of electro-static destruction can be prevented that much at the time of contact with the solid-state imaging device 101, and the metal material is more suitable.

The solid-state imaging device 101 and the light transmitting member 103, which are arranged in parallel to each other as described above, are attached to this holding member 102. The attachment method is to bring the side of the solid-state imaging device 101 to the positioning portions 102a (the positioning portions 102a at three positions illustrated in FIG. 2 in the present embodiment) to meet the side to the positioning portions 102a. At the same time, bonding is performed with the adhesion surface side of an extending portion of the light transmitting member 103 to the solid-state imaging device 101 close to the holding member 102 (see FIG. 3B). In this case, as illustrated in FIGS. 3A and 3B, the light transmitting member 103 may be made to adhere to the holding member 102 with a sealing resin 105, or the light transmitting member 103 may be made to adhere to the holding member 102 with an adhesive separately.

By adopting this configuration, the light transmitting member 103 can be attached to the holding member 102 in parallel to it. Because the light transmitting member 103 and the solid-state imaging device 101 have already been bonded together in parallel to each other, the position (position in focusing direction) of the solid-state imaging device 101 to the holding member 102 can be made to be constant. Moreover, the positions of the up, down, left, and right tilts can be made to be always constant in order to preventing partial blurring.

That is, by bonding the light transmitting member 103 and the solid-state imaging device 101 together on the basis of the holding member 102 while keeping the light transmitting member 103 and the solid-state imaging device 101 in parallel to each other, the adjustment of the position of the solid-state imaging device 101 to the holding member 102 in the focusing direction (Z direction) . . . (1) is completed. At the same time, the adjustments of the three axes of the up, down, left, and right tilts . . . (2), (3) are completed.

Furthermore, since the bonding of the solid-state imaging device 101 to the light transmitting member 103 is performed by contacting the side of the solid state imaging device 101 bonded to the light transmitting member 103 with the positioning portions 102a formed on the holding member 102 (bringing the side to meet the positioning portions 102a), the positions of the solid-state imaging device 101 to the holding member 102 in the horizontal and vertical directions and in the tilt and rotational directions can be always made to be constant. That is, the adjustments in three axes in the horizontal and vertical directions (X and Y directions) . . . (4), (5), and the rotational direction (θ) . . . (6) can be completed. These adjustments in the six directions (1)-(6) are the same as those described in the clause of Description of the Related Art.

At this time point the structure of the present invention is in the state in which all of the six axis adjustment of the solid-state imaging device 101 to the holding member 102 have been completed. Moreover, it is desirable to form a fixing unit including at least a holding hole in the holding member 102. Moreover, one or more positioning holes may be formed in the holding member 102 in addition to the holding hole.

Positioning holes 102c and holding holes 102b are formed in the holding member 102 as illustrated in FIGS. 1 and 2 in the present embodiment, which is an example of the formation of two positioning holes 102c and three holding holes 102b. These holes can be formed in the holding member 102 accurately by publicly known drilling or punching.

Consequently, the position of the solid-state imaging device 101 can be uniquely determined to the positions of the holding holes 102b of the holding member 102, and the solid-state imaging apparatus always keeping a fixed state positional relation can be provided.

Moreover, the fixing unit (holding holes 102b) is formed on the side of the solid-state imaging apparatus, and the bonding portion (holding holes or the like) corresponding to the fixing unit is accurately formed on the side of the electronic imaging apparatus, such as a digital camera and a digital video camera. By the formation of these fixing units and bonding portion, desired accuracy of the solid-state imaging apparatus to the electronic imaging apparatus can be easily acquired only by bonding the solid-state imaging apparatus of the present invention to the electronic imaging apparatus by the use of the fixing unit.

At this time, as described above, the six axis adjustment of the solid-state imaging device 101 to the holding member 102 have been completed. Consequently, by incorporating the solid-state imaging apparatus of the present invention into the electronic imaging apparatus by the use of the fixing unit (holding holes 102b) formed in the holding member 102, the solid-state imaging apparatus can be simply incorporated without performing the six axis adjustment.

The sealing resin 105 illustrated in FIGS. 3A and 3B is formed to cover the outer periphery of the spacers 106 and adhesive 107 here. Moreover, although it is not illustrated, the sealing resin 105 may be formed to completely cover the back surface (non-light receiving surface side) of the solid-state imaging device 101. The sealing resin 105 is, for example, the one made of an epoxy resin having an excellent moisture resistance, and no limitations to the sealing resin 105 exist especially. But a sealing resin of the type of being cured by heat, an ultraviolet ray, or concomitant use of both of them is suitable.

By forming the sealing resin 105 in such a way, the moisture resistance of the solid-state imaging device 101 and the reliability of the mechanical and electrical bonding of the conductive foil 104c, which is a bonding portion member, can be improved. As a unit covering the back surface of the solid-state imaging device 101, a protecting member 112 (illustrated in FIG. 4) may be made to adhere to the back surface in addition to the method of using the sealing resin 105.

Figure 4:
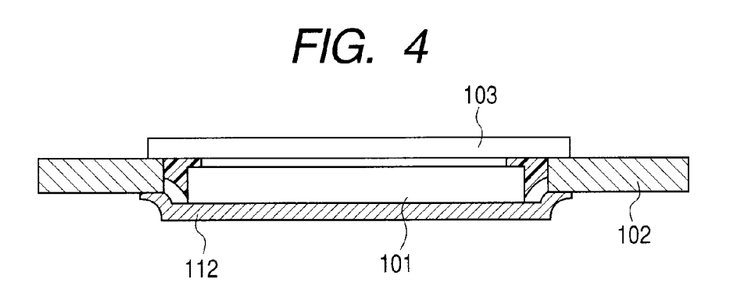
FIG. 4 is a sectional view illustrating an embodiment of a solid-state imaging apparatus of the present invention with a protecting member covering the back surface of the solid-state imaging apparatus.

FIG. 4 is a sectional view illustrating an embodiment covering the back surface (non-light receiving surface side) of the solid-state imaging device 101 with the protecting member 112. In FIG. 4, the same parts as those in FIGS. 1 and 2 are denoted by the same reference characters as those of FIGS. 1 and 2. The material of the protecting member 112 is not especially limited, but, for example, iron-nickel alloys, such as 42 alloy, 50 alloy, permalloy, Kovar, and Invar, and stainless steel metals, such as SUS 430 and SUS 304, each having high thermal conductivity, are suitably used. By using the material having the high thermal conductivity, the material can also assume the role of a radiator plate.

Moreover, although the protecting member 112 is made to adhere to the holding member 102, it is preferable to make the back surface of the solid-state imaging device 101 adhere to the protecting member 112 by the use of an adhesive having high thermal conductivity in the case of aiming both of the protection and heat radiation of the solid-state imaging device 101.

Although the solid-state imaging apparatus of the present invention is sometimes fixed to an electronic imaging apparatus by being directly attached thereto, the similar advantages can be acquired also by attaching the solid-state imaging apparatus to another unit part once and then by fixing solid-state imaging apparatus to the electronic imaging apparatus by fixing the unit part thereto. Although the unit part is not especially limited, for example, a unit part including an optical part, such as an optical low-pass filter, mounted on the solid-state imaging apparatus of the present invention can be given.

Figure 5:
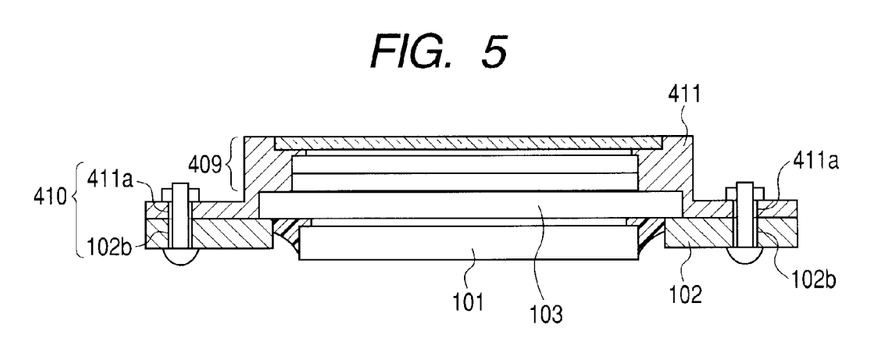
FIG. 5 is a sectional view illustrating a solid-state imaging unit according to the present invention.

FIG. 5 illustrates an example of a unit (hereinafter referred to as solid-state imaging unit) including an optical part, such as the optical low-pass filter, placed on a solid-state imaging apparatus. In FIG. 5, the same parts as those illustrated in FIGS. 1 to 4 are denoted by the same reference characters as those of FIGS. 1 to 4. In FIG. 5, the optical low-pass filter 409 is mounted on the solid-state imaging apparatus of the present invention. The solid-state imaging unit 410 includes the solid-state imaging apparatus and the optical low-pass filter 409. The filter 409 includes an infrared cut filter composed of an infrared absorbing glass and a dichroic mirror, and a low-pass filter composed of a separating plate separating a subject image into a horizontal direction and a vertical direction and a phase plate.

The optical low-pass filter 409 is fixed to an optical low-pass filter holding member 411, in which holding holes 411a are formed at the positions corresponding to the holding holes 102b formed in the solid-state imaging apparatus.

The optical low-pass filter holding member 411 equipped with the optical low-pass filter 409 is bonded to the solid-state imaging apparatus by adjusting the relative positions of the holding holes 102b and 411a on the basis of the holding member 102 of the solid-state imaging apparatus. By forming the optical low-pass filter holding member 411 with accuracy, a fixed state positional relation between the solid-state imaging apparatus and the optical low-pass filter 409 can be held in the solid-state imaging unit 410.

Figure 6:
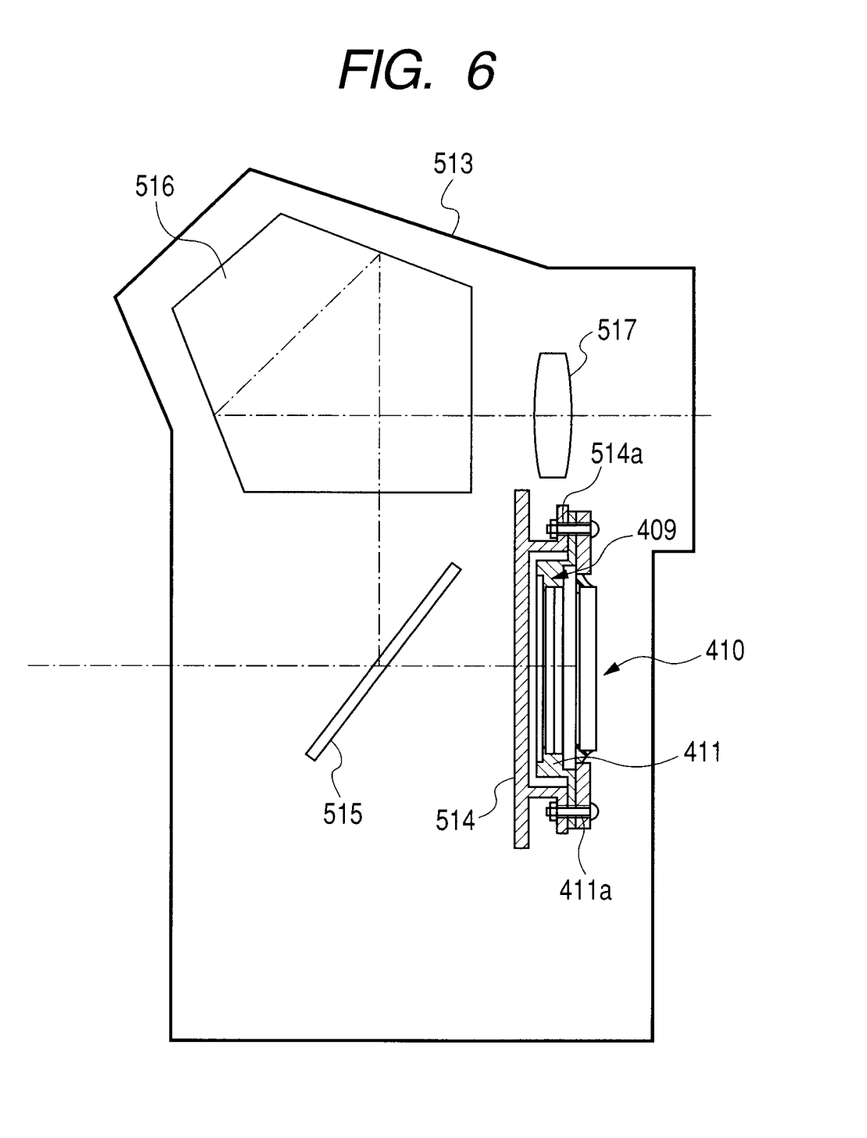
FIG. 6 is a schematic view illustrating an embodiment of an electronic imaging apparatus mounted with a solid-state imaging unit according to the present invention.

FIG. 6 is a view illustrating an example of incorporating the solid-state imaging unit 410 illustrated in FIG. 5 into a camera (electronic imaging apparatus). In FIG. 6, the same parts as those in FIG. 5 are denoted by the same reference characters as those in FIG. 5. In FIG. 6, the camera includes a camera body 513, a shutter unit 514, and a mirror 515, which is obliquely provided in the imaging path or withdraws therefrom according to an observation state and an imaging state, respectively.

In the observation state, the mirror 515 is in the state of being obliquely provided in the imaging optical path, and advances a light bundle reflected on the mirror 515 toward the upper part of the camera body 513. The reflected light bundle passes through a penta-prism 516 and a finder optical system 517 to enable an observation image to be observed on the finder.

Moreover, in the imaging state the mirror 515 is in the state of withdrawing from the imaging optical path, and the light bundle enters the solid-state imaging unit 410 through the optical low-pass filter 409, constituting the solid-state imaging unit 410, during the shutter unit 514 is opened.

The solid-state imaging unit 410 is bonded to the shutter unit 514 constituting a part of the camera body 513. Holding holes 514a for bonding the solid-state imaging unit 410 are formed in the shutter unit 514 at the positions thereof corresponding to the holding holes 102b of the solid-state imaging apparatus. Although the relative positional relations of the holding holes 514a to the holding holes 411a formed in the optical low-pass filter holding member 411 may not be the same, the relative positional relations may be made to be the same. In this case, the optical low-pass filter holding member 411 and the shutter unit 514 can be fixed to the solid-state imaging apparatus all together.

If the bonded side of the solid-state imaging unit 410 has been produced with accuracy, the optical system of the camera can be configured with accuracy only by fixing the solid-state imaging unit 410 even when the solid-state imaging unit 410 is incorporated into the camera body 513, and no adjustments are especially required. That is, the six axis adjustment of the solid-state imaging device to the holding member 102 have been completed, and consequently the adjustment of the relative positional relation between the solid-state imaging device 101 and the optical viewfinder and the adjustment of the imaging focusing direction are rendered to be unnecessary even when the solid-state imaging unit 410 is incorporated in the camera body 513. Consequently, adjustment steps can be reduced to a large extent, and inexpensive electronic imaging apparatus can be provided.

As many apparently widely different embodiments of the present invention can be made without departing from the spirit and scope thereof, it is to be understood that the invention is not limited to the specific embodiments thereof except as defined in the claims.

This application claims priority from Japanese Patent Application No. 2008-210528 filed on Aug. 19, 2008, which is hereby incorporated by reference herein.

What is claimed is:

1. A solid-state imaging apparatus comprising:
   a solid-state imaging device including a top face, a bottom face, and a side face;
   a light transmitting member including an area, and an extending portion extending from the area; and
   a holding member,
   wherein the holding member includes a top face, a bottom face, a side face surrounding a single space penetrating through the holding member from the top face of the holding member to the bottom face of the holding member, and a positioning portion constructed by a part of the side face of the holding member protruding to the single space,
   wherein the solid-state imaging device is arranged in the single space at the center of the holding member, and
   wherein the side face of the solid-state imaging device contacts with the positioning portion of the holding member, and a part of the side face of the holding member except for the positioning portion is separated from the side face of the solid-state imaging device.

2. The apparatus according to claim 1, wherein the light transmitting member and the top face of the solid-state imaging device are bonded together by an adhesive.

3. The apparatus according to claim 2, wherein the adhesive includes a spacer member.

4. The apparatus according to claim 2, wherein the extending portion is fixed to the holding member.

5. The apparatus according to claim 4, wherein the solid-state imaging device includes electrodes formed at both of opposing sides thereof, and the extending portion is arranged above a side of the solid-state imaging device at which the electrode is not formed.

6. The apparatus according to claim 5, wherein the adhesive bonding between the light transmitting member and the solid-state imaging device is positioned between a light receiving surface of the solid-state imaging device and the electrode.

7. The apparatus according to claim 2, wherein the holding member includes a holding hole.

8. The apparatus according to claim 2, wherein the adhesive bonding between the light transmitting member and the solid-state imaging device is different from an adhesive bonding between the light transmitting member and the holding member bonding between the holding member and the solid-state imaging device.

9. The apparatus according to claim 1, further comprising a protecting member covering the bottom face of the solid-state imaging device opposite to the top face.

10. The apparatus according to claim 1, further comprising a plurality of positioning portions protruding from a part of the side face and extending into the space.

11. The apparatus according to claim 10, wherein the plurality of positioning portions protrude from different sides of the side face.

12. An electronic imaging apparatus comprising:
a solid-state imaging apparatus according to claim 1, wherein the holding member includes a holding hole; and
a camera body,
wherein a solid-state imaging unit including the solid-state imaging apparatus is fixed through the holding hole to the camera body.

13. An electronic imaging apparatus according to claim 12, wherein the solid-state imaging apparatus includes a filter.

14. The apparatus according to claim 1, wherein the holding member is a plate-like member.

15. The apparatus according to claim 1, wherein, viewing from a top, a relation: a length of the solid-state imaging device< a length of the space< a length of the light transmitting member is met.

16. The apparatus according to claim 1, wherein the holding member is formed from an alloy of iron and nickel or stainless steel.

17. The apparatus according to claim 1, wherein the solid-state imaging device and the holding member are arranged at the same level under the light transmitting member.

18. The apparatus according to claim 1, wherein the top face of the solid-state imaging device is arranged in parallel to the top face of the holding member.

19. The apparatus according to claim 1, wherein the extending portion of the light transmitting member fixes to the solid-state imaging device and the holding member.

20. The apparatus according to claim 1, wherein the solid-state imaging device is surrounded by the side face of the holding member.

21. A manufacturing method of a solid-state imaging apparatus comprising:
preparing a solid-state imaging device including a top face, a bottom face, and a side face, and including a light receiving region at the top face thereof;
preparing a light transmitting member including an area, and an extending portion extending from the area;
preparing a holding member including a top face, a bottom face, and a side face surrounding a single space at the center of the holding member, penetrating through the holding member from the top face of the holding member to the bottom face of the holding member, the holding member including a positioning portion constructed by a part of the side face of the holding member and protruding into the single space;
fixing the area of the light transmitting member to the top face of the solid-state imaging device;
contacting a side of the solid-state imaging device to the positioning portion of the holding member, the solid-state imaging device being positioned within the single space, and a part of the side face of the holding member except for the positioning portion being separated from the side face of the solid-state imaging device; and
fixing the extending portion of the light transmitting member to the holding member.

22. The manufacturing method according to claim 21, wherein, in fixing the light transmitting member, the light transmitting member and the top face of the solid-state imaging device are bonded together by an adhesive containing a spacer member, such that the spacer member maintains the constant interval between the light transmitting member and the top face of the solid-state imaging device.

23. The manufacturing method according to claim 21, wherein the solid-state imaging device includes electrodes formed at both of opposing sides thereof, and the extending portion of the light transmitting member is arranged above a side of the solid-state imaging device at which the electrode is not formed.

24. The manufacturing method according to claim 21, further comprising covering with a protecting member the bottom face of the solid-state imaging device opposite to the top face of the solid-state imaging device.

25. The manufacturing method according to claim 21, wherein the holding member includes a holding hole.

26. The manufacturing method according to claim 21, further comprising the providing a plurality of positioning portions protruding from a part of the side face of the holding member and extending into the single space.

27. The manufacturing method according to claim 26, wherein the plurality of positioning portions protrude from different sides of the side face.

28. The manufacturing method according to claim 21, wherein the extending portion of the light transmitting member fixes to the solid-state imaging device and the holding member.

29. The manufacturing method according to claim 21, wherein the solid-state imaging device is surrounded by the side face of the holding member.

* * * * *